(12) United States Patent
Kim

(10) Patent No.: US 7,568,961 B2
(45) Date of Patent: Aug. 4, 2009

(54) MODULE FOR MANUFACTURING A DISPLAY DEVICE, METHOD OF MANUFACTURING THE SAME, AND METHOD OF MANUFACTURING A DISPLAY DEVICE USING THE SAME

(75) Inventor: Sung-Jin Kim, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 644 days.

(21) Appl. No.: 11/404,208

(22) Filed: Apr. 14, 2006

(65) Prior Publication Data

US 2007/0013303 A1    Jan. 18, 2007

(30) Foreign Application Priority Data

Jul. 15, 2005    (KR) .................... 10-2005-0064440

(51) Int. Cl.
*H01J 9/00*    (2006.01)
(52) U.S. Cl. .............................. 445/24; 445/25; 445/66
(58) Field of Classification Search .................... 445/24, 445/25, 66; 206/701–728, 562–564
See application file for complete search history.

(56) References Cited

U.S. PATENT DOCUMENTS 4,930,634 A * 6/1990 Williams et al. ............ 206/454

5,524,765 A * 6/1996 Gutentag .................... 206/713

FOREIGN PATENT DOCUMENTS

| CN | 2541855 | 3/2003 |
|---|---|---|
| JP | 2003-287740 | 10/2003 |
| WO | WO 2005/047200 | 5/2005 |

OTHER PUBLICATIONS

Abstract, Publication No. 2003-287740, Oct. 10, 2003, 1 p.

* cited by examiner

*Primary Examiner*—Mariceli Santiago
(74) *Attorney, Agent, or Firm*—Haynes and Boone, LLP.

(57) ABSTRACT

A module for manufacturing a display device, a method for manufacturing the module, and a method for manufacturing a display device using the module, are provided. The module includes a solid substrate, a first flexible substrate, a second flexible substrate, and a third flexible substrate in one embodiment. The solid substrate has an upper surface and a lower surface facing to the upper surface. The first flexible substrate is on the upper surface of the solid substrate, and the second flexible substrate is on the first flexible substrate and has an opening to receive a flexible display substrate that has a display element. The third flexible substrate is on the lower surface of the solid substrate to prevent a bending of the solid substrate. Advantageously, a malfunction of pixels of the display element is decreased, and the module for manufacturing the display device may be recycled to decrease a manufacturing cost of the display device.

18 Claims, 8 Drawing Sheets

MODULE FOR MANUFACTURING A DISPLAY DEVICE, METHOD OF MANUFACTURING THE SAME, AND METHOD OF MANUFACTURING A DISPLAY DEVICE USING THE SAME

CROSS REFERENCE TO RELATED APPLICATION

The present application claims priority from Korean Patent Application No. 2005-64440, filed on Jul. 15, 2005, the disclosure of which is hereby incorporated herein by reference in its entirety.

BACKGROUND OF THE INVENTION

1. Field of the Invention

The present invention relates to a module for manufacturing a display device, a method of manufacturing the module, and a method of manufacturing the display device using the module. More particularly, the present invention relates to a module for manufacturing a flexible display device, a method of manufacturing the module, and a method of manufacturing the flexible display device using the module.

2. Description of the Related Art

A display device, in general, converts an electric signal that is processed by an information processing device into an image. The display device includes a liquid crystal display (LCD) device, an organic light emitting device (OLED), a plasma display device (PDP), etc. The LCD and the PDP include a plurality of pixels for displaying the image. The pixels are formed on a solid substrate such as a glass substrate so that the solid substrate is not flexible.

A flexible display device has also been developed. However, when the flexible display device is bent during a manufacturing process of the flexible display device, the pixels are damaged by a compression or an expansion of the flexible display device.

SUMMARY OF THE INVENTION

The present invention advantageously provides a module for manufacturing a flexible display device, a method of manufacturing the above-mentioned module, and a method of manufacturing the above-mentioned flexible display device using the above-mentioned module.

In accordance with one embodiment of the present invention, a module for manufacturing a display device includes a solid substrate, a first flexible substrate, a second flexible substrate, and a third flexible substrate. The solid substrate has an upper surface and a lower surface facing to the upper surface. The first flexible substrate is on the upper surface of the solid substrate. The second flexible substrate is on the first flexible substrate, and has an opening to receive a flexible display substrate that has a display element. The third flexible substrate is on the lower surface of the solid substrate to prevent a bending of the solid substrate.

In accordance with another embodiment of the present invention, a method of manufacturing a display device is provided as follows. A solid substrate having an upper surface and a lower surface facing to the upper surface is prepared. A first flexible substrate is attached to the upper surface of the solid substrate. A second flexible substrate is attached to the lower surface of the solid substrate. A third flexible substrate having an opening is attached to the first flexible substrate.

A method of manufacturing a display device in accordance with yet another embodiment of the present invention is provided as follows. A module including a solid substrate that has an upper surface and a lower surface facing to the upper surface, a first flexible substrate on the upper surface, a second flexible substrate on the lower surface to prevent a bending of the solid substrate, and a third flexible substrate on the first flexible substrate and having an opening, is prepared. A flexible display substrate is arranged in the opening. A sealing member is formed on an interface between the display substrate and the third flexible substrate. A display element is formed on the display substrate. The sealing member is cut so that the display substrate may be separated from the module.

Advantageously, the present invention decreases a malfunction of the pixels of a display device, and the module for manufacturing the display device may be recycled to decrease a manufacturing cost of the display device.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

The above and other advantages of the present invention will become more apparent by describing in detail embodiments thereof with reference to the accompanying drawings, in which.

Figure 1:
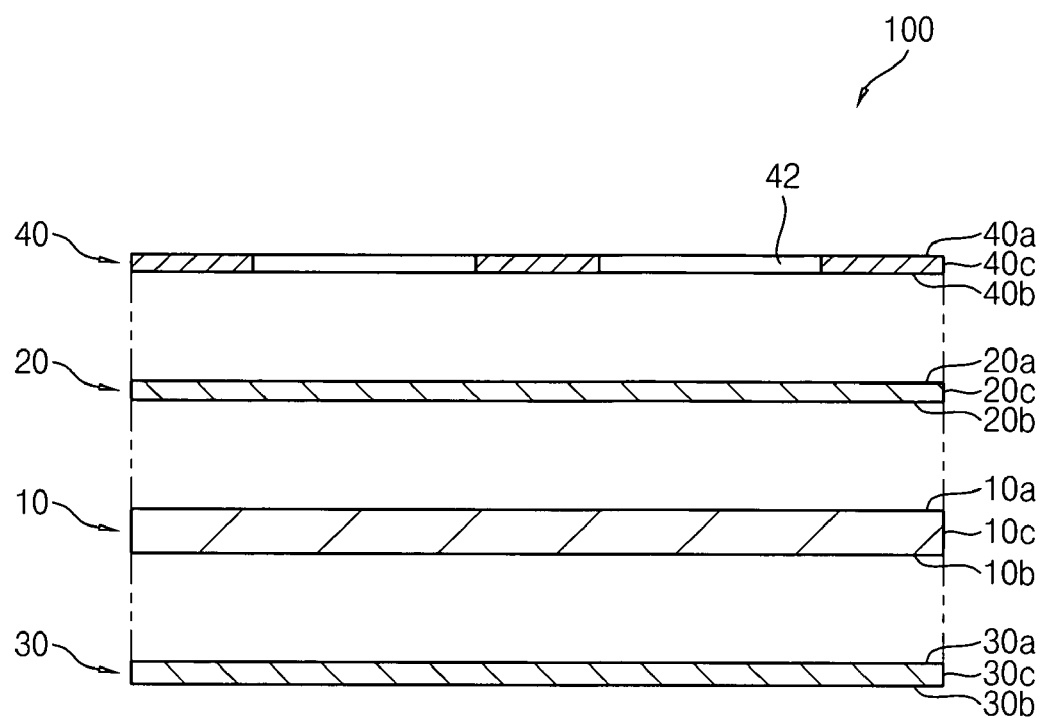
FIG. 1 is an exploded cross-sectional view showing a module for manufacturing a display device in accordance with one embodiment of the present invention.

Embodiments of the present invention and their advantages are best understood by referring to the detailed description that follows. It should be appreciated that like reference numerals are used to identify like elements illustrated in one or more of the figures. It should also be appreciated that the figures may not be necessarily drawn to scale.

DETAILED DESCRIPTION

The invention is described more fully hereinafter with reference to the accompanying drawings, in which embodiments of the invention are shown. This invention may, however, be embodied in many different forms and should not be construed as being limited to the embodiments set forth herein. Rather, these embodiments are provided so that this disclosure will be thorough and complete, and will convey the scope of the invention to those skilled in the art. In the drawings, the size and relative sizes of layers and regions may be exaggerated for clarity.

It will be understood that when an element or layer is referred to as being "on", "connected to", or "coupled to" another element or layer, the element or layer can be directly on, connected to, or coupled to the other element or layer or intervening elements or layers may be present. In contrast, when an element is referred to as being "directly on," "directly connected to", or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

Module for Display Device

Figure 2:
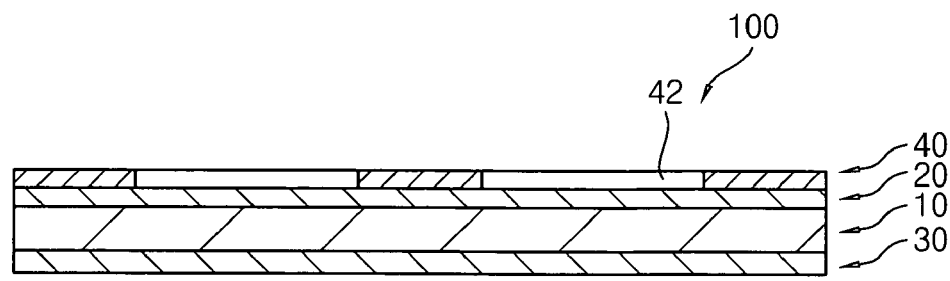
FIG. 2 is a cross-sectional view showing the assembled module for manufacturing a display device shown in FIG. 1.
Figure 3:
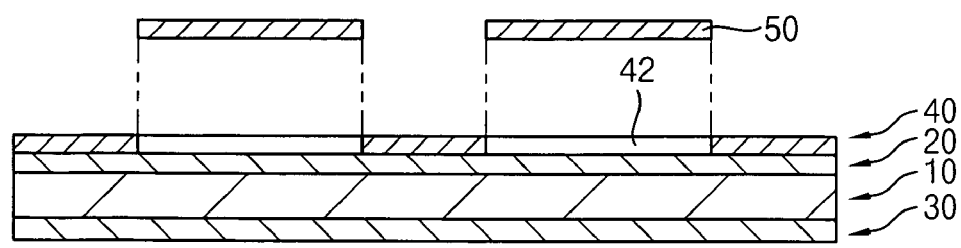
FIG. 3 is a cross-sectional view showing a flexible display substrate in an opening of a second flexible substrate shown in FIG. 2.

FIG. 1 is an exploded cross-sectional view showing a module for manufacturing a display device in accordance with one embodiment of the present invention. FIG. 2 is a cross-sectional view showing the module for manufacturing the display device shown in FIG. 1. FIG. 3 is a cross-sectional view showing a flexible display substrate in an opening of a second flexible substrate shown in FIG. 2.

Referring to FIGS. 1 to 3, the module 100 for manufacturing the display device includes a solid substrate 10, a first flexible substrate 20, a second flexible substrate 30, and a third flexible substrate 40.

The solid substrate 10 may have a substantially rectangular plate shape having an upper surface 10a, a lower surface 10b corresponding to the upper substrate 10a and four side surfaces 10c.

In one example, the solid substrate 10 is a glass substrate having a first hardness and a thermal expansion coefficient of about $1.0 \times 10^{-6}$ mm/° C. The hardness of the solid substrate 10 may be tested by various means and methods, including but not limited to the Brinell hardness test, the Rockwell hardness test, and the Vickers hardness test.

The first flexible substrate 20 has a substantially rectangular plate shape having an upper surface 20a, a lower surface 20b facing to the upper surface 20a, and four side surfaces 20c. In one example, a first thickness of the first flexible substrate 20 (length between 20a and 20b) may be about 150 μm. The lower surface 20b of the first flexible substrate 20 is on the upper surface 10a of the solid substrate 10. The lower surface 20b of the first flexible substrate 20 may be attached to the upper surface 10a of the solid substrate 10 through an adhesive member or a double sided tape in one example. Other adhesion means and methods are within the scope of the present invention.

In FIGS. 1 to 3, the first flexible substrate 20 has a second hardness that is smaller than the first hardness of the solid substrate 10. The hardness of the first flexible substrate 20 may be tested by various means and methods, including but not limited to the Brinell hardness test, the Rockwell hardness test, and the Vickers hardness test.

The first flexible substrate 20 may be a flexible synthetic resin substrate having a thermal expansion coefficient of about $50 \times 10^{-6}$ mm/° C. The first flexible substrate 20 may include polyetheretherketone (PEEK) in one example.

The first flexible substrate 20 may absorb a stress formed by a difference between the thermal expansion coefficients of a flexible display substrate 50 and the solid substrate 10 to prevent a drifting or a separation of the flexible display substrate 50 from the solid substrate 10. In one example, a pressure between the first and second flexible substrates and the display substrate is smaller than an atmospheric pressure.

The second flexible substrate 30 has a substantially rectangular plate shape having an upper surface 30a, a lower surface 30b facing to the upper surface 30a, and four side surfaces 30c. The upper surface 30a of the second flexible substrate 30 is on the lower surface 10b of the solid substrate 10.

A second thickness of the second flexible substrate 30 may be equal to or greater than the first thickness of the first flexible substrate 20. For example, the second thickness may be about 150 μm.

The upper surface 30a of the second flexible substrate 30 may be attached to the lower surface 10b of the solid substrate 10 through an adhesive member or a double sided tape in one example. Other adhesion means and methods are within the scope of the present invention.

In FIGS. 1 to 3, the second flexible substrate 30 has a third hardness that is smaller than the first hardness of the solid substrate 10. The hardness of the second flexible substrate 30 may be tested by various means and methods including but not limited to the Brinell hardness test, the Rockwell hardness test, and the Vickers hardness test.

The second flexible substrate 30 may be a flexible synthetic resin substrate having a thermal expansion coefficient of about $50 \times 10^{-6}$ mm/° C. The second flexible substrate 30 may include polyetheretherketone (PEEK) in one example. The second flexible substrate 30 may have substantially the same thermal expansion coefficient and hardness as the first flexible substrate 20.

The second flexible substrate 30 may absorb a stress formed by a difference between the thermal expansion coefficients of the first flexible substrate 20 and the solid substrate 10 to prevent a bending of the solid substrate 10 and the first flexible substrate 20.

The third flexible substrate 40 is on the upper surface 20a of the first flexible substrate 20. The third flexible substrate 40 may have substantially the same thermal expansion coefficient and hardness as the first and second flexible substrates 20 and 30. The third flexible substrate 40 has an opening 42 to receive the flexible display substrate 50.

In FIGS. 1 to 3, the flexible display substrate 50 includes a plurality of pixels for displaying an image, and a thermal expansion coefficient of the flexible display substrate 50 is about $20 \times 10^{-6}$ mm/° C. to about $30 \times 10^{-6}$ mm/° C.

The third flexible substrate 40 has an upper surface 40a, a lower surface 40b facing to the upper surface 40a, and four side surfaces 40c. The lower surface 40b of the third flexible substrate 40 is on the upper surface 20a of the first flexible substrate 20. For example, the lower surface 40b of the third flexible substrate 40 is attached to the upper surface 20a of the first flexible substrate 20 through an adhesive or a double sided tape in one example. Other adhesion means and methods are within the scope of the present invention. A thickness of the third flexible substrate 40 may be about 120 μm. The third flexible substrate 40 fixes the flexible display substrate 50 to the upper surface 20a of the first flexible substrate 20.

Figure 4:
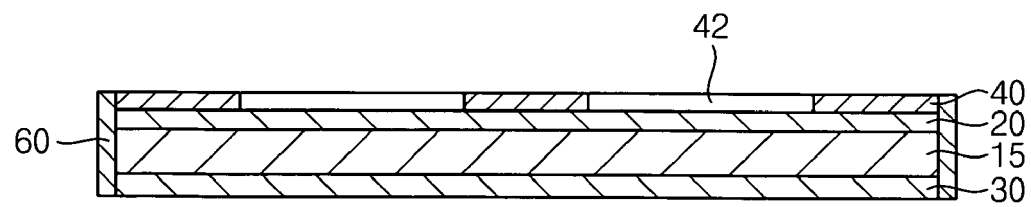
FIG. 4 is a cross-sectional view showing a module for manufacturing a display device in accordance with another embodiment of the present invention.

FIG. 4 is a cross-sectional view showing a module for manufacturing a display device in accordance with another embodiment of the present invention. The module for manufacturing the display device of FIG. 4 is substantially the same as in FIGS. 1 to 3 except for a protecting wall and a solid substrate. Thus, the same reference numerals will be used to refer to the same or like parts as those described in FIGS. 1 to 3 and further explanation with respect to the same or like parts will be omitted.

Referring to FIG. 4, the solid substrate 15 may be a metal substrate in one example. The solid substrate 15 includes a strong metal that may not be substantially deformed. Examples of the metal that can be used for the solid substrate 15 include but are not limited to aluminum, aluminum alloy, and stainless steel.

When the solid substrate 15 includes a metal, the solid substrate 15 may be eroded during a manufacturing process of pixels on a flexible display substrate. The manufacturing process may be one of various processes, including but not limited to a wet etching process and a dry etching process. In order to prevent the erosion of the solid substrate 15, a protecting wall 60 may be formed on the side surfaces of the solid surface 15.

The protecting wall 60 may include a material substantially the same as the first flexible substrate 20, the second flexible substrate 30, and the third flexible substrate 40. Alternatively, the protecting wall 60 may include various synthetic resins that are resistant to an etchant of the wet etching process, a plasma, or the dry etching process, etc.

Method of Manufacturing Module for Display Device

Figure 5:
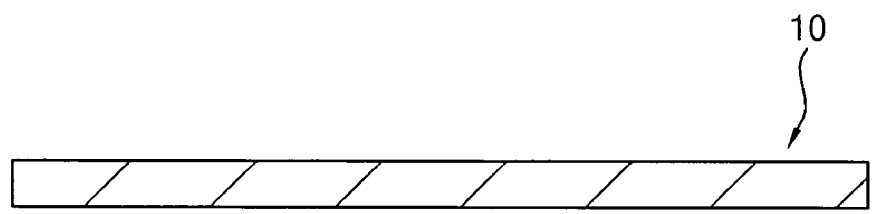
FIG. 5 is a cross-sectional view showing the beginning of a method of manufacturing a module for a display device in accordance with one embodiment of the present invention.

FIG. 5 is a cross-sectional view showing the beginning of a method of manufacturing a module for a display device in accordance with one embodiment of the present invention. Referring to FIG. 5, in order to manufacture the module 100 for the display device, a solid substrate 10 is prepared. In one example, the solid substrate 10 is a glass substrate having a substantially quadrangular shape when viewed on a plane.

Figure 6:
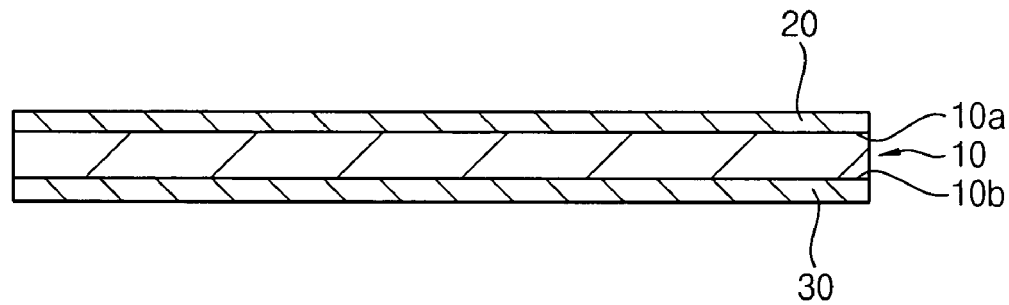
FIG. 6 is a cross-sectional view showing a first flexible substrate and a second flexible substrate manufactured by the method of manufacturing a module for a display device.

FIG. 6 is a cross-sectional view showing a first flexible substrate and a second flexible substrate manufactured by the method of manufacturing the module for the display device shown in FIG. 5.

The first flexible substrate 20 is on an upper surface 10a of the solid substrate 10. The first flexible substrate 20 is attached to the solid substrate 10 through an adhesive or a double sided tape in one example. Other adhesion means and methods are within the scope of the present invention. In FIG. 6, the first flexible substrate 20 may include polyetheretherketone (PEEK) in one example.

When the upper surface 10a of the solid substrate 10 is attached to the first flexible substrate 20, the second flexible substrate 30 is formed on a lower surface 10b of the solid substrate 10. The lower surface 10b of the solid substrate 10 faces to the upper surface 10a of the solid substrate 10. The second flexible substrate 30 is attached to the solid substrate 10 through an adhesive or a double sided tape in one example. Other adhesion means and methods are within the scope of the present invention. The second flexible substrate 30 may include polyetheretherketone (PEEK) in one example.

In FIG. 6, after the first flexible substrate 20 is attached to the upper surface 10a of the solid substrate 10, the second flexible substrate 30 is attached to the lower surface 10b of the solid substrate 10. Alternatively, the first flexible substrate 20 may be attached to the upper surface 10a of the solid substrate 10 after the second flexible substrate 30 is attached to the lower surface 10b of the solid substrate 10.

Figure 7:
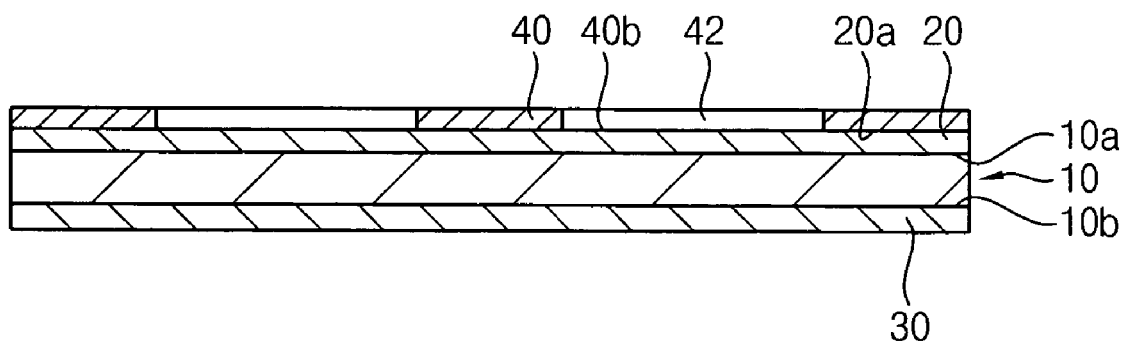
FIG. 7 is a cross-sectional view showing a third flexible substrate manufactured by the method of manufacturing a module for a display device.

FIG. 7 is a cross-sectional view showing a third flexible substrate manufactured by the method of manufacturing a module for a display device. Referring to FIG. 7, the third flexible substrate 40 is formed on an upper surface 20a of the first flexible substrate 20 and includes an opening 42. The third flexible substrate 40 is attached to the first flexible substrate 20 through an adhesive or a double sided tape in one example. Other adhesion means and methods are within the scope of the present invention. The third flexible substrate 40 may include polyetheretherketone (PEEK) in one example.

In FIG. 7, an adhesive member or a double sided tape may not be formed on an exposed portion of the first flexible substrate 20 corresponding to the opening 42 of the third flexible substrate 40.

The solid substrate 10 may be a glass substrate in one example. Alternatively, the solid substrate 10 may be a metal substrate. When the solid substrate 10 is a metal substrate, a protecting wall may be formed on side surfaces of the solid substrate 10 to prevent erosion of the metal substrate.

Method of Manufacturing Display Device

Figure 8:
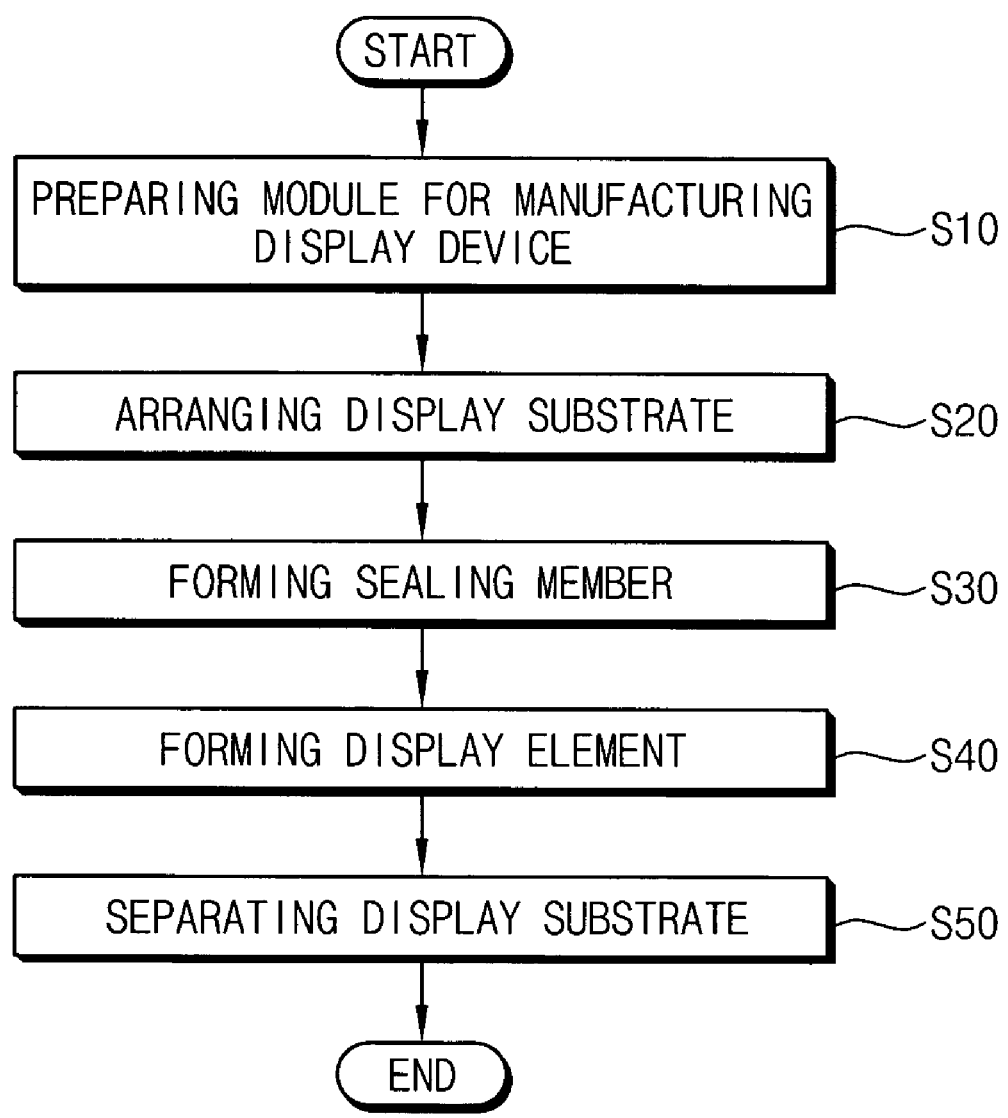
FIG. 8 is a flow chart showing a method of manufacturing a display device in accordance with one embodiment of the present invention.
Figure 9:
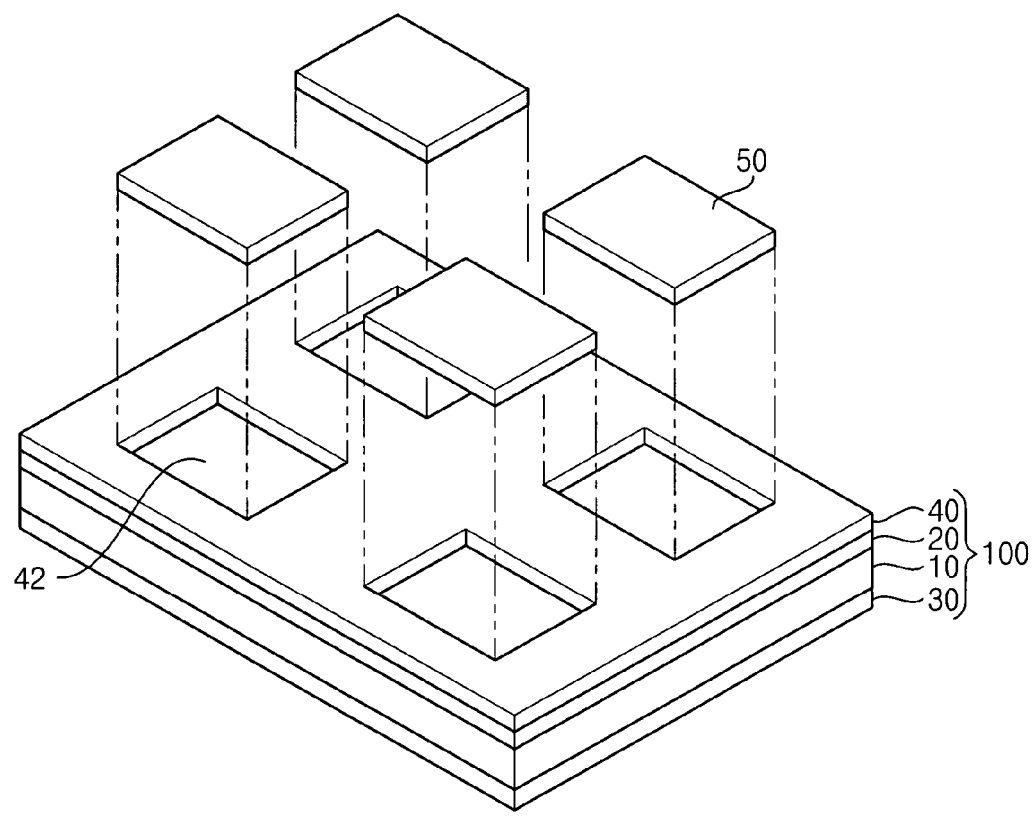
FIG. 9 is a perspective view showing a module for manufacturing a display device in accordance with another embodiment of the present invention.

FIG. 8 is a flow chart showing a method of manufacturing a display device in accordance with an embodiment of the present invention. FIG. 9 is a perspective view showing a module for manufacturing a display device in accordance with another embodiment of the present invention.

Referring to FIGS. 8 and 9, the module 100 for manufacturing the display device is prepared (step S10).

The module 100 for manufacturing a display device includes a solid substrate 10, a first flexible substrate 20, a second flexible substrate 30, and a third flexible substrate 40. The solid substrate 10 may include a metal substrate or a glass substrate in one example. The first flexible substrate 20 is on an upper surface of the solid substrate 10. The second flexible substrate 30 is on a lower surface of the solid substrate 10. The third flexible substrate 40 is on an upper surface of the first flexible substrate 20. In FIGS. 8 and 9, the third flexible substrate 40 includes an opening 42 to receive a flexible display substrate 50.

Referring again to FIG. 8, the flexible display substrate 50 is arranged in a space formed by the opening 42 of the third flexible substrate 40 of the module 100 for manufacturing the display device (step S20). A plurality of pixels is formed on the flexible display substrate 50 to display an image.

Figure 10:
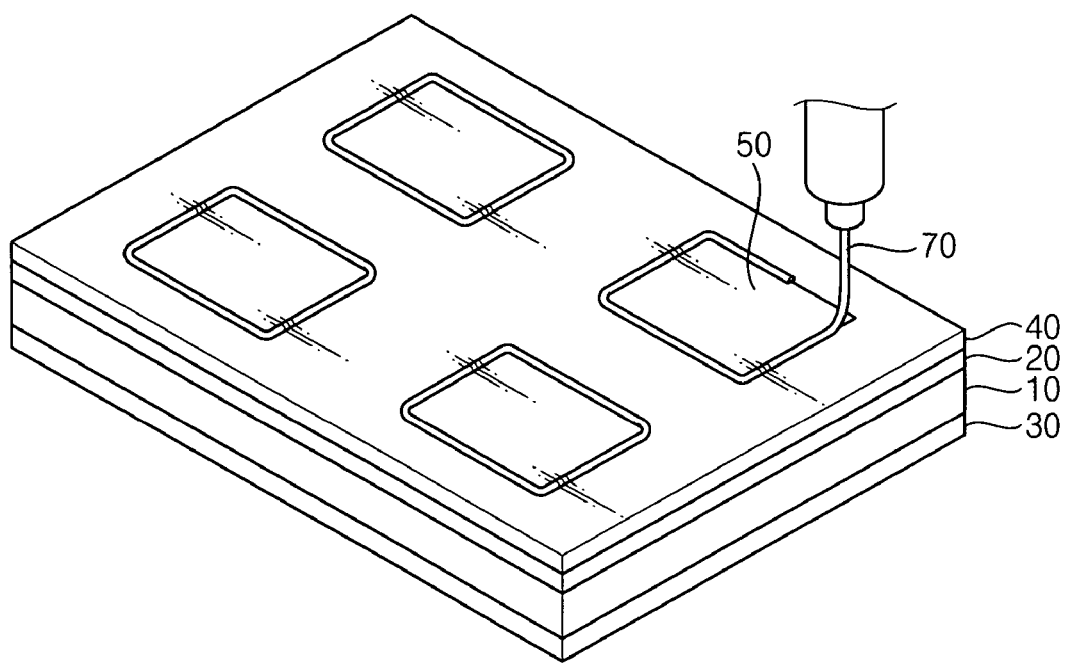
FIG. 10 is a cross-sectional view showing a sealing member in accordance with the method of manufacturing the display device shown in FIG. 9.

FIG. 10 is a cross-sectional view showing a sealing member in accordance with the method of manufacturing the display device shown in FIG. 9.

Referring to FIGS. 8 and 10, after the flexible display substrate 50 is arranged on the module 100 for manufacturing the display substrate, a sealing member 70 is formed on an interface between the flexible display substrate 50 and the third flexible substrate 40 (step S30). The sealing member 70 is an adhesive in one example. The sealing member 70 prevents an inflow of air, oxygen, and/or moisture through a space between the flexible display substrate 50 and the third flexible substrate 40.

Before forming the sealing member on the interface between the flexible display substrate 50 and the third flexible substrate 40, air between the flexible display substrate 50 and the first and third flexible substrates 30 and 40 is discharged from the module 100 for manufacturing the display device. In one example, in order to discharge the air from the module 100 for manufacturing the display device, an upper surface of the flexible display substrate 50 that is on the module 100 for manufacturing the display device is compressed by a roller to remove the air from a space between the flexible display substrate 50 and the first and third flexible substrates 30 and 40.

Referring again to FIG. 8, after the sealing member 70 is formed on the module 100 for manufacturing the display substrate, a plurality of display elements that include the pixels are formed on the upper surface of the flexible display substrate 50 (step S40), thereby completing the display device having the pixels.

Figure 11:
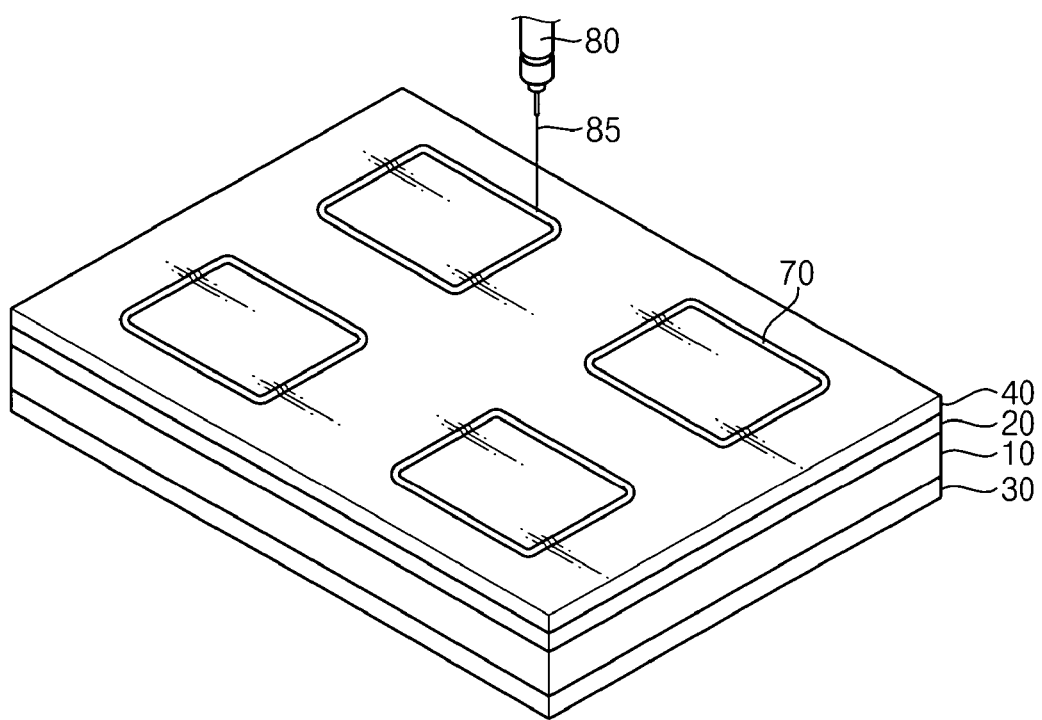
FIG. 11 is a perspective view showing a method of separating the display device from a module for the display device shown in FIG. 10.

FIG. 11 is a perspective view showing a method of separating the display device from a module for the display device shown in FIG. 10.

Referring to FIG. 11, a laser beam 85 that is generated from a laser beam generating device 80 is irradiated onto the sealing member 70 so that the display device is separated from the module 100 for manufacturing the display device. After the sealing member 70 is separated from the module 100 for manufacturing the display device, the display device is separated from the module 100 for manufacturing the display device (step S50). The display device includes the display substrate 50 and the pixels on the display substrate 50.

Advantageously, the sealing member 70 that remains on the module 100 for manufacturing a display device may be recycled when the module 100 for manufacturing the display device is optionally recycled. According to the present invention, the pixels for displaying the image may be formed on the flexible substrate, and yield of the pixels of the flexible substrate is increased.

This invention has been described with reference to the above-referenced embodiments. It is evident, however, that many alternative modifications and variations are possible to those having skill in the art in light of the foregoing description. Accordingly, the present invention embraces all such alternative modifications and variations as fall within the spirit and scope of the appended claims.

What is claimed is:

1. A module for manufacturing a display device comprising:
   a solid substrate having an upper surface and a lower surface facing to the upper surface;
   a first flexible substrate on the upper surface of the solid substrate;
   a second flexible substrate on the first flexible substrate, the second flexible substrate having an opening to receive a flexible display substrate that has a display element; and
   a third flexible substrate on the lower surface of the solid substrate to prevent a bending of the solid substrate.

2. The module of claim 1, wherein the solid substrate has a first thermal expansion coefficient and the display substrate has a second thermal expansion coefficient that is greater than the first thermal expansion coefficient.

3. The module of claim 2, wherein the first to third flexible substrates comprise a third thermal expansion coefficient that is greater than the first thermal expansion coefficient and smaller than the second thermal expansion coefficient.

4. The module of claim 1, wherein the solid substrate is a glass substrate.

5. The module of claim 1, wherein the first to third flexible substrates comprise polyetheretherketone (PEEK).

6. The module of claim 1, further comprising an adhesive member between the solid substrate and the first flexible substrate, between the first and second flexible substrates, and between the solid substrate and the third flexible substrate.

7. The module of claim 1, wherein a first thickness of the first flexible substrate is smaller than a second thickness of the second flexible substrate.

8. The module of claim 1, wherein a pressure between the first and second flexible substrates and the display substrate is smaller than an atmospheric pressure.

9. The module of claim 1, wherein the solid substrate is a metal substrate.

10. The module of claim 9, wherein the solid substrate further comprises a protecting wall on side surfaces of the solid substrate.

11. A method of manufacturing a module for manufacturing a display device, the method comprising:
preparing a solid substrate having an upper surface and a lower surface facing to the upper surface;
attaching a first flexible substrate to the upper surface of the solid substrate;
attaching a second flexible substrate to the lower surface of the solid substrate; and
attaching a third flexible substrate having an opening to the first flexible substrate.

12. The method of claim 11, wherein the solid substrate is a glass substrate.

13. The method of claim 11, wherein the first to third flexible substrates comprise polyetheretherketone (PEEK).

14. The method of claim 11, wherein the solid substrate is a metal substrate, and a protecting wall is formed on exposed side surfaces of the metal substrate to prevent erosion of the metal substrate.

15. A method of manufacturing a display device, the method comprising:
preparing a module including a solid substrate that has an upper surface and a lower surface facing to the upper surface, a first flexible substrate on the upper surface, a second flexible substrate on the lower surface to prevent a bending of the solid substrate, and a third flexible substrate on the first flexible substrate and having an opening;
arranging a flexible display substrate in the opening;
forming a sealing member on an interface between the display substrate and the third flexible substrate;
forming a display element on the display substrate; and
cutting the sealing member so that the display substrate is separated from the module.

16. The method of claim 15, further comprising removing an air between the display substrate and the first and second flexible substrates after the arranging of the flexible display substrate in the opening.

17. The method of claim 16, wherein the removing of air comprises compressing the display substrate by a roller.

18. The method of claim 16, wherein the cutting of the sealing member comprises irradiating a laser beam.

* * * * *